United States Patent
Venegas et al.

(10) Patent No.: US 7,298,046 B2
(45) Date of Patent: Nov. 20, 2007

(54) SEMICONDUCTOR PACKAGE HAVING NON-CERAMIC BASED WINDOW FRAME

(75) Inventors: Jeffrey Venegas, San Diego, CA (US); Paul Garland, San Diego, CA (US); Joshua Lobsinger, San Diego, CA (US); Linda Luu, Poway, CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 10/339,834

(22) Filed: Jan. 10, 2003

(65) Prior Publication Data

US 2004/0195662 A1    Oct. 7, 2004

(51) Int. Cl.
| | |
|---|---|
| *H01L 23/12* | (2006.01) |
| *H01L 23/02* | (2006.01) |
| *H01L 23/057* | (2006.01) |
| *H01L 23/047* | (2006.01) |
| *H01L 23/34* | (2006.01) |

(52) U.S. Cl. .............. 257/732; 257/E23.104; 257/E23.185; 257/E23.189; 257/E23.092; 257/E23.124; 257/E23.293; 257/699; 257/730; 257/710; 257/712; 257/713; 257/700; 257/701; 257/664; 257/659; 257/729; 257/746; 257/676; 257/675; 257/708; 361/746; 361/709; 361/807; 361/715

(58) Field of Classification Search ........ 257/E23.104, 257/E23.185, E23.189, E23.092, E23.124, 257/E23.192, E23.026, E23.082, E23.111, 257/732, 676, 700–702, 758, 664, 725, 724, 257/699, 708, 678, 730, 710, 81, 746, 670, 257/673, 675, 659, 729, 712, 713, 717, 720, 257/728; 361/746, 709, 807, 715; 174/52.4

See application file for complete search history.

(56) References Cited

U.S. PATENT DOCUMENTS 3,767,839 A  *  10/1973  Beal .................... 174/52.3

(Continued)

FOREIGN PATENT DOCUMENTS

EP           0475575 A1  *  5/1991

(Continued)

*Primary Examiner*—Alexander Oscar Williams
(74) *Attorney, Agent, or Firm*—Hogan & Hartson LLP

(57) ABSTRACT

A semiconductor package for power transistors and the like has a heat sink flange with at least one die mounted thereon, a non-ceramic based window frame mounted thereon adjacent the die, and a plurality of leads mounted on the window frame and electrically coupled to the die by wire bonds. The non-ceramic based window frame is thermally matched to copper or other highly conductive material typically used for the flange, to facilitate assembly of the semiconductor package at high temperatures. The non-ceramic based window frame is flexible and is thermally matched to the highly conductive flange so as to expand and contract at a rate similar to the flange to prevent failure during assembly of the semiconductor package. The non-ceramic based material of the window frame includes a matrix of principally organic material, such as polytetrafluoroethylene, filled with fibers which may be glass fibers or ceramic fibers. The matrix is clad in a metal such as copper or aluminum, and may be coated with nickel and gold to facilitate bonding of the window frame to the flange and the leads with gold/germanium solder. The window frame may also be bonded to the flange using epoxy. Cladding of the window frame may be performed by laminating copper or other cladding metal on the matrix in a sufficient thickness so as to form the flange. The flange may be provided with a pedestal extending upwardly from an upper surface at a central portion thereof to define a die attach area and forming a barrier to brazing material used to join the window frame to the flange.

3 Claims, 4 Drawing Sheets

U.S. PATENT DOCUMENTS

| | | | |
|---|---|---|---|
| 4,385,342 A * | 5/1983 | Puppolo et al. | 361/531 |
| 4,725,347 A * | 2/1988 | Pimlott | 204/254 |
| 4,784,974 A * | 11/1988 | Butt | 29/827 |
| 4,930,857 A * | 6/1990 | Acarlar | 385/88 |
| 5,650,592 A * | 7/1997 | Cheskis et al. | 174/52.4 |
| 5,766,740 A * | 6/1998 | Olson | 428/209 |
| 5,792,984 A * | 8/1998 | Bloom | 174/564 |
| 5,832,598 A * | 11/1998 | Greenman et al. | 29/840 |
| 5,926,372 A * | 7/1999 | Rinehart et al. | 361/704 |
| 6,056,186 A * | 5/2000 | Dickson et al. | 228/122.1 |
| 6,113,730 A * | 9/2000 | Ohya et al. | 156/307.3 |
| 6,114,048 A * | 9/2000 | Jech et al. | 428/547 |
| 6,332,720 B1 * | 12/2001 | Shimaoka et al. | 385/88 |
| 6,365,961 B1 * | 4/2002 | Tomie | 257/664 |
| 6,462,413 B1 * | 10/2002 | Polese et al. | 257/732 |
| 6,500,529 B1 * | 12/2002 | McCarthy et al. | 428/209 |
| 6,544,638 B2 * | 4/2003 | Fischer et al. | 428/322.7 |
| 6,671,449 B1 * | 12/2003 | Yuan et al. | 385/135 |
| 6,727,117 B1 * | 4/2004 | McCoy | 438/106 |
| 6,829,823 B2 * | 12/2004 | Downes et al. | 29/852 |
| 6,867,367 B2 * | 3/2005 | Zimmerman | 174/52.4 |
| 6,952,049 B1 * | 10/2005 | Ogawa et al. | 257/700 |
| 6,982,483 B2 * | 1/2006 | McLaughlin et al. | 257/728 |
| 6,998,180 B2 * | 2/2006 | Ludtke et al. | 428/610 |
| 2003/0107046 A1 * | 6/2003 | Waitl et al. | 257/81 |
| 2003/0131476 A1 * | 7/2003 | Ocher et al. | 29/890.03 |
| 2003/0201530 A1 * | 10/2003 | Kurihara et al. | 257/712 |
| 2004/0046247 A1 * | 3/2004 | Tower | 257/708 |
| 2004/0195701 A1 * | 10/2004 | Attarwala | 257/783 |
| 2004/0246682 A1 * | 12/2004 | Osakada et al. | 361/709 |
| 2005/0029535 A1 * | 2/2005 | Mazzochette et al. | 257/100 |

FOREIGN PATENT DOCUMENTS

| | | | |
|---|---|---|---|
| EP | 0859408 A2 * | 8/1998 | |
| EP | 0932199 A2 * | 7/1999 | |
| JP | 63-109104 | * | 5/1988 |
| JP | 8-31480 | * | 2/1996 |
| JP | 2000-77462 | * | 3/2000 |
| JP | 2000-150746 A | * | 5/2000 |
| JP | 2002-252299 A | * | 9/2002 |
| WO | WO 95/15007 | * | 6/1995 |

* cited by examiner

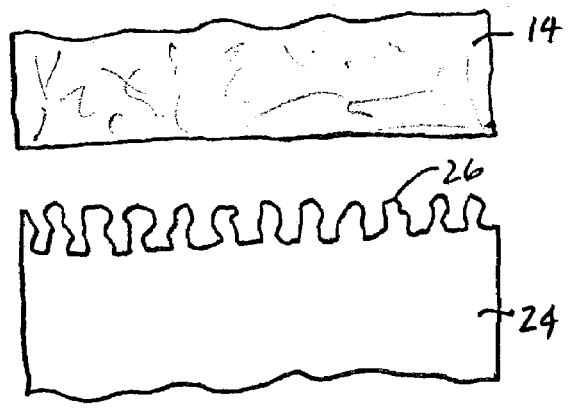
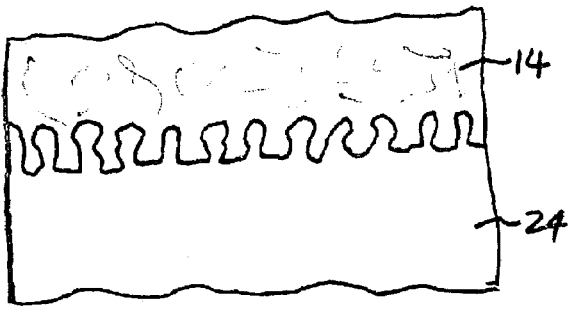
FIG.-4A    FIG.-4B
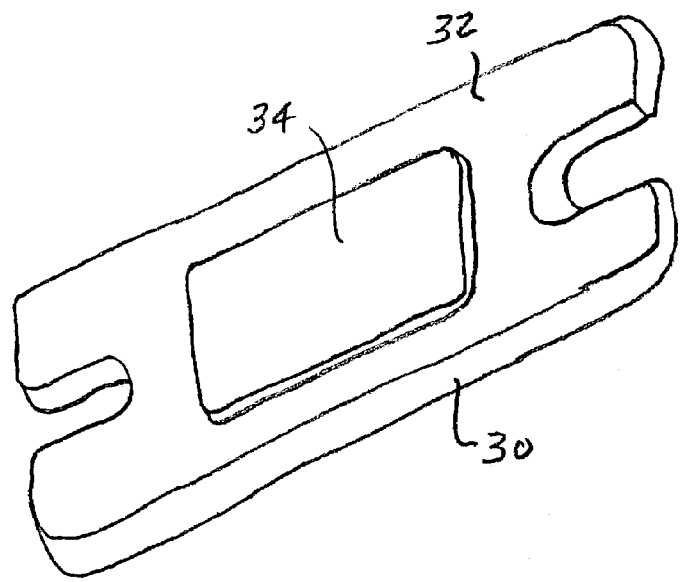
FIG.-5

SEMICONDUCTOR PACKAGE HAVING NON-CERAMIC BASED WINDOW FRAME

BACKGROUND OF THE INVENTION

1. Field of the Invention

The present invention relates to semiconductor packages, and more particularly to packages in which one or more dies are mounted on a flange within an opening in a window frame mounted on the flange and having leads mounted thereon.

2. History of the Prior Art

It is known in the art to provide semiconductor packages in which one or more semiconductor dies are mounted on a heat sink flange within an opening in a window frame which mounts and insulates a plurality of leads. The dies may be of the LDMOS (lateral diffusion metal oxide semiconductor) type and the package of the type for packaging LDMOS power transistors. The window frame, which is typically made of ceramic based materials such as alumina, serves to mount the leads on the semiconductor package and insulate the leads from the heat sink flange and other portions of the package. The window frame has an opening therein which surrounds the semiconductor dies. The dies are electrically coupled to the conductors such as by wire bonds.

In semiconductor packages of the type described, the components parts thereof, including the flange, the window frame and the leads, are joined together such as by brazing/soldering to form a header. One or more dies are then mounted such as by brazing/soldering/adhering to the header and are electrically attached to the leads such as by wire bonding. During assembly of the header, the semiconductor package is typically subjected to very high temperatures on the order of 700-900° C. in order to carry out brazing. Such high temperatures dictate that the materials being joined, including particularly the heat sink flange and the window frame, have similar coefficients of thermal expansion (CTE). Ideally, the flange is made of highly conductive materials such as copper. However, because the alumina or other ceramic materials of the window frame has a much lower rate of thermal expansion, it is often necessary to make the flange of less conductive material having a closer CTE match to the ceramic material of the window frame. Without such a close CTE match, the flange and the window frame expand and contract at substantially different rates so as to place substantial stresses on the package. Complicating such situations is the brittle nature of the ceramic material of the window frame, causing it to break or otherwise fail as a result of such stresses.

It would therefore be desirable to provide a semiconductor package allowing for the use of highly conductive materials such as pure copper for the heat sink flange. The material of the window frame should provide a close CTE match with the flange, and should ideally be flexible and not brittle in order to better withstand the stresses that may occur during assembly of the package.

Further problems may arise during assembly of the header, particularly when brazing is used to join the parts together. The top surface of the flange within the opening in the window frame forms a die attach area for mounting one or more dies. Such die attach area must be smooth and free of brazing material in order to properly attach the dies thereto. However, during assembly of the header, the brazing material at the interface between the window frame and the flange may flow into the die attach area so as to interfere with the subsequent mounting of the die within such area. It would therefore be desirable to prevent such brazing material from flowing into the die attach area during assembly of the header.

BRIEF DESCRIPTION OF THE INVENTION

The present invention provides improved semiconductor packaging structures. More particularly, the present invention provides an improved window frame which makes possible the use of highly conductive materials in the heat sink flange while at the same time preventing undue stressing and failure during the assembly process.

In accordance with the invention, the window frame is made of non-ceramic based material, such as PTFE with glass fibers. The modulus of elasticity, as shown in Table 1 below, for a non-ceramic based window frame made of PTFE with glass fibers is significantly lower than a traditional window frame made of alumina. The lower modulus indicates that the material is less stiff and less prone to a failure.

TABLE 1

Traditional vs. New Header Design

| | | Material Properties | | |
| --- | --- | --- | --- | --- |
| Component | Material | CTE in X – Y (ppm) | Thermal Conductivity (W/mK) | Modulus Elasticity (Gpa) |
| Window Frame | Alumina | ~7 | | 360 |
| | PTFE matrix + glass fibers | 24 | | 1 |
| Heatsink (Flange) | Copper Tungsten | ~7 | ~200 | 240 |
| | Copper | 17 | 398 | 120 |

Semiconductor packaging structures in accordance with the invention also provide an improved flange having a raised pedestal at a central portion thereof so as to define a separate, raised die attach area within the opening of the window frame. The pedestal prevents brazing materials from flowing onto the die attach area during assembly of the header.

Semiconductor packages in accordance with the invention comprise a window frame of non-ceramic based material which provides a close CTE match to pure copper or other highly conductive materials which may be used to form the heat sink flange as shown in Table 1. As the difference in CTE between two bonding components increases, the stresses within the components increase as well. Pure copper or other high thermally conductive materials provides a significant enhancement to the operating performance of the electronic package. Traditional packages using an alumina window frame are limited to a less conductive heat sink flange such as copper tungsten to better match the CTE. The non-ceramic based material includes a matrix of principally organic material filled with fibers or other geometrical fillers. The matrix may consist of polytetrafluoroethylene (PTFE) or epoxy, and the fibers may be glass or ceramic fibers/fillers. Preferably, the non-ceramic based material is clad with metal to provide a wetable surface for brazing/soldering or other bonding of the window frame to the other components of the header. The application temperature of the solder/braze/adhesive must be below the decomposition temperature of the non-ceramic window frame. Depending on the selection, the surface condition of the cladding can be coated accordingly. In the case with gold/germanium soldering material, preferably the cladding is coated with nickel and gold, particularly where, most preferably, gold/germaninum solder is used to join the window frame to the other components. The metal used for cladding of the matrix preferably comprises either copper or aluminum.

The non-ceramic based material of window frames according to the invention has thermal characteristics providing a close CTE match with the relatively pure copper or other highly conductive material preferred for use as the heat sink flange. Because of such match, the stresses that might otherwise occur due to uneven amounts of thermal expansion and contraction are avoided. In addition, the non-ceramic based material of the window frame is flexible in nature so as to further reduce the likelihood of cracking or failure which might otherwise result.

The non-ceramic based material of window frames according to the invention may be attached to the flange and to the leads such as by brazing. A braze/solder/adhesive material may be used to join the parts, in which case the dies may be subsequently bonded to the flange with a material possessing a lower melting temperature compared to conventional header assemblies so as not to disturb the bonds created during the package assembly. See Table 2 for examples.

TABLE 2

Bonding Material Matrix for Header and Die

| Header Components (meltinig point of braze/solders) | Bonding Material for Die (melting point of braze/solders) | | |
|---|---|---|---|
| 72Ag28Cu (780C) | 88Au12Ge (356C) | 80Au20Sn (280C) | 63Sn37Pb (183C) |
| 88Au12Ge (356C) | 80Au20Sn (280C) | 63Sn37Pb (183C) | |
| 80Au20Sn (280C) | 63Sn37Pb (183C) | | |

Note:
adhesives may be used where applicable

The non-ceramic based material of the window frame may be clad by various methods such as lamination, rolling, autoclave, or plating. By choosing copper or other metal of appropriate thickness for cladding to the non-ceramic based material of the window frame, such metal can also form the heat sink flange and/or leads to create the desired structure. In the case where electrical isolation spacing is required, the metal attached to the non-ceramic based material can be patterned by lithographic exposure or mechanical abrasion. Preferably, the non-ceramic based material with metal attached is lithographically processed to obtain metal pattern.

In accordance with the invention, the flange may be formed with a raised pedestal extending upwardly from the flat upper surface at a central portion thereof so as to define a die attach area for mounting one or more dies on the flange. The raised pedestal fits within the opening in the window frame and forms a barrier to brazing material around the die attach area. During brazing of the window frame to the flange, such barrier prevents the brazing material from flowing onto the die attach area.

BRIEF DESCRIPTION OF THE DRAWINGS

A detailed description of preferred embodiments of the invention will be made with reference to the accompanying drawings, in which:

FIGS. 4A and 4B are greatly enlarged sectional views showing the manner in which the non-ceramic based material of the window frame is clad with metal, in the semiconductor package of FIG. 1.

FIG. 5 is a perspective view of an alternative embodiment of a flange having a raised pedestal in accordance with the invention.

DETAILED DESCRIPTION OF THE PREFERRED EMBODIMENTS

Figure 1:
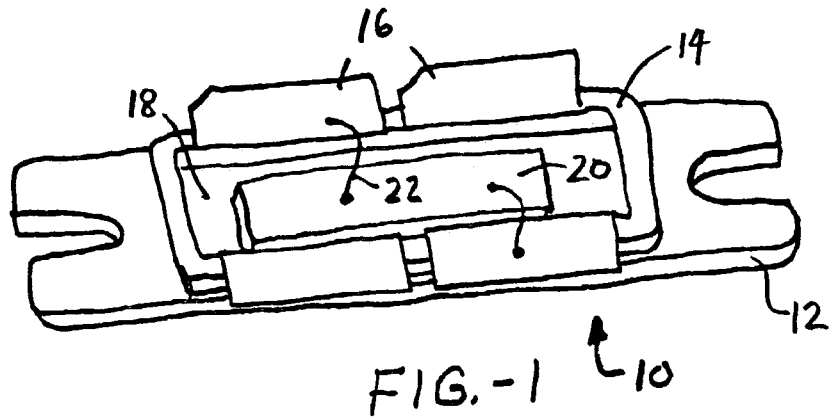
FIG. 1 is a perspective view of a semiconductor package in accordance with the invention.

FIG. 1 shows a semiconductor package 10 in accordance with the invention. The package 10 of FIG. 1 includes a heat sink flange 12 of elongated, flat, generally planar configuration, having a window frame 14 mounted thereon. A plurality of leads 16 are mounted on the window frame 14 opposite the flange 12. The window frame 14 has an opening 18 therein exposing a portion of the flange 12. A semiconductor die 20 is mounted on the flange 12 within the opening 18, and is electrically coupled to the leads 16. Such electrical coupling may be accomplished with wire bonds 22, two of which are shown in FIG. 1 for illustration. A single die 20 is shown for purposes of illustration, and plural dies may be mounted within the opening 18 if desired. A lid (not shown) may be mounted on the leads 16 so as to extend over and enclose the opening 18 and the included die 20.

Figure 2:
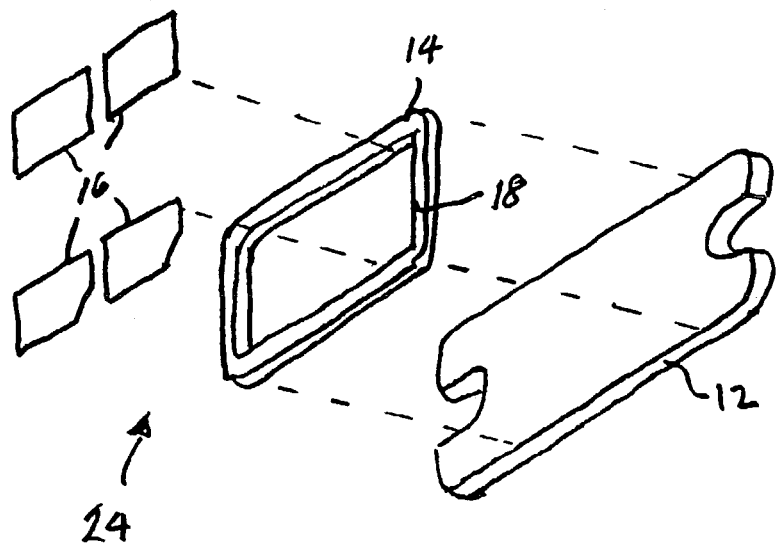
FIG. 2 is an exploded view of the components forming the header of the semiconductor package of FIG. 1.

FIG. 2 is an exploded view of several of the components of the semiconductor package 10 FIG. 1 showing the manner in which they are assembled to form a header 24. The header 24 includes the flange 12, the window frame 14 and the lead 16. The window frame 14 is joined to the flange 12, such as by brazing, following which the leads 16 are mounted in similar fashion onto the window frame 14 opposite the flange 12. The semiconductor package 10 is completed by mounting one or more of the dies 20 within the window frame 14 of the header 24 and electrically coupling the dies 20 to the leads 16 by wire bonding. Epoxy or other potting compound may then be used to fill the opening 18, with a lid then being installed over the package 10, as desired.

Figure 3:
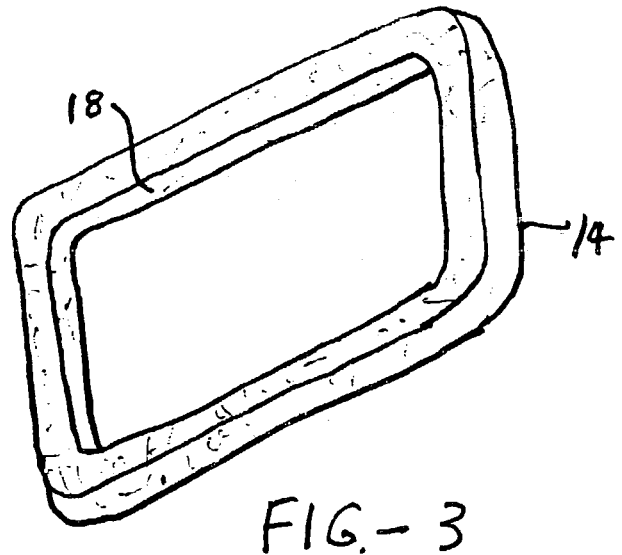
FIG. 3 is a large perspective view of the window frame of the semiconductor package of FIG. 1.

The semiconductor package 10 of FIG. 1 is of conventional configuration, except for the window frame 14. In accordance with the invention, the window frame 14, which is shown in enlarged and detailed fashion in FIG. 3, is made of non-ceramic based material. Preferably, such material includes a matrix of principally organic material filled with fibers or other geometrical filler. The matrix may comprise PTFE or epoxy. The fibers or filler may consist of glass or ceramic.

Unlike the alumina or other ceramic based material typically used for the window frame in conventional semiconductor packages, the non-ceramic based material of the window frame 14 according to the invention provides a number of distinct advantages. The non-ceramic based material of the window frame 14 provides a close thermal expansion or CTE match to the highly conductive copper or other materials preferably used for the flange 12. As a result, when the flange 12, the window frame 14 and the lead 16 are subjected to high temperature, typically on the order of 400° C. or greater, during brazing together of such components to form the header 24, the window frame 14 undergoes thermal expansion and contraction at a rate similar to that of the highly conductive flange 12. As a result, the high thermal stresses present in prior art structures and methods are avoided (Refer to Table 1 for details). Moreover, and unlike the ceramic based material of conventional window frames, the non-ceramic based material of the window frame 14 according to the invention is not brittle, but rather is flexible in nature, thereby further avoiding the fractures and other failures which occur with conventional structures.

To provide the window frame 14 with a wetable surface for purposes of brazing or otherwise bonding to the other components, the window frame 14 is preferably clad with a layer of metal such as copper or aluminum. Due to the nature of the non-ceramic based material of the window frame 14, it can be difficult to provide a good bond between the cladding metal and the non-ceramic based material. However, a good bond is provided by the technique shown in FIGS. 4A and 4B. FIG. 4A shows the window frame 14 spaced apart from a cladding layer 24 of metal. A surface 26 of the cladding layer 24 is roughened, as shown in FIG. 4A, before the cladding layer 24 is disposed against the window frame 14. The layer 24 is then laminated to the window frame 14 by applying pressure and elevated temperature. The non-ceramic based material of the window frame 14 flows into the roughened surface 26 of the cladding layer 24. After a sufficient amount of time, the structure is cooled and the pressure is removed. The final, laminated product is shown in FIG. 4B. As shown in FIG. 4B, the roughened surface 26 integrates with the window frame 14 to form a very strong bond between materials which are otherwise difficult to bond together. The cladding layer 24 may then be plated such as with nickel and gold in preparation for bonding with gold/germanium solder. A preferred solder has the composition 88Au12Ge, although other solders can be used.

In accordance with a feature of the invention, the cladding and laminating operation shown in FIGS. 4A and 4B can be used to provide the window frame 14 with a flange attached thereto, at the same time as the cladding layer is formed. Simply by making the cladding layer 24 of sufficient thickness so as to form a flange of appropriate thickness, such flange is formed at the bottom of the window frame 14 as the cladding layer 24 is bonded to the window frame 14. This eliminates the need to form a separate flange 12 and attach such flange to the window frame 14.

In accordance with the invention, the flange 12, the window frame 14 and the leads 16 of the header 24 can be joined together using various processes. As previously noted, gold/germanium solder can be used to join the window frame 14 to both the flange 12 and the leads 16. Where such method is used, the window frame 14 is preferably coated with nickel and then gold following the metal cladding thereof Alternatively, the window frame 14 can be bonded without soldering/brazing. This is accomplished using epoxy or any suitable adhesive. Epoxies have strong adhesion to the non-ceramic based window frame. At the same time, they are capable of bonding to copper or aluminum cladding as well as to nickel/gold platting on the window frame 14. Epoxy can be used to bond the window frame 14 to both the flange 12 and the lead 16.

As previously described, lamination techniques can be used to join the flange 12 directly to the non-ceramic based material of the window frame 14. Also, as previously described in connection with FIGS. 4A and 4B, the cladding layer 24 can be provided with sufficient thickness so that it forms the flange 12 when joined to the window frame 14.

FIG. 5 shows an alternative embodiment of a flange 30 in accordance with the invention. The flange 30 is like the flange 12 of FIGS. 1 and 2 in that it is of elongated, relatively thin, generally planar configuration and has a flat upper surface 32 thereon. Unlike the flange 12 of FIGS. 1 and 2 however, the flange 30 of FIG. 5 has a raised portion or pedestal 34 extending upwardly from a central portion of the flat upper surface 32. The pedestal 34 is configured such that the outer peripheral thereof fits within the opening 18 of the window frame 14, when the window frame 14 is mounted on the flange 30. The pedestal 34 itself has a flat upper surface 36 defining a die attach area.

Figure 6A:
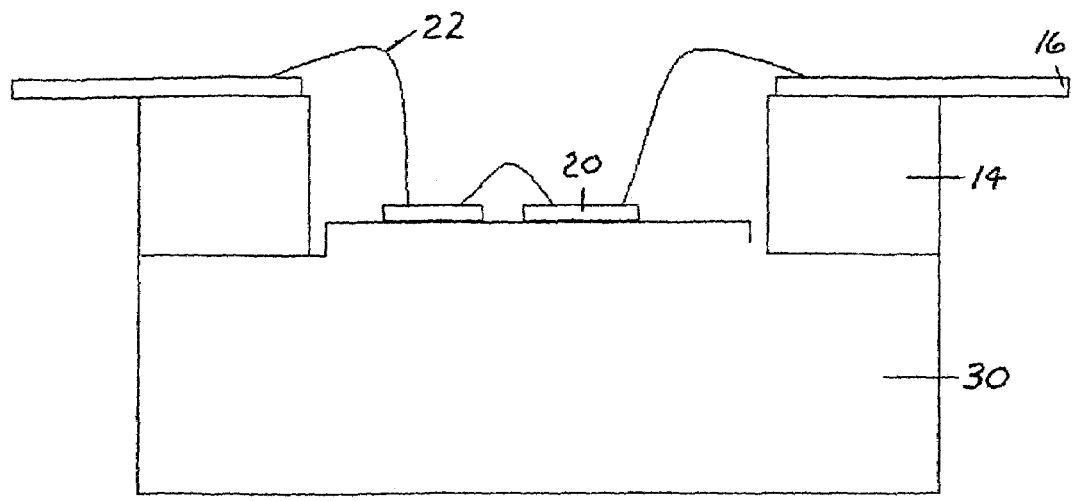
FIG. 6A and 6B are sectional views of a portion of a semiconductor package with the flange of FIG. 5 installed therein, and showing the manner in which the pedestal prevents brazing material from flowing into a die attach area of the flange.
Figure 6B:
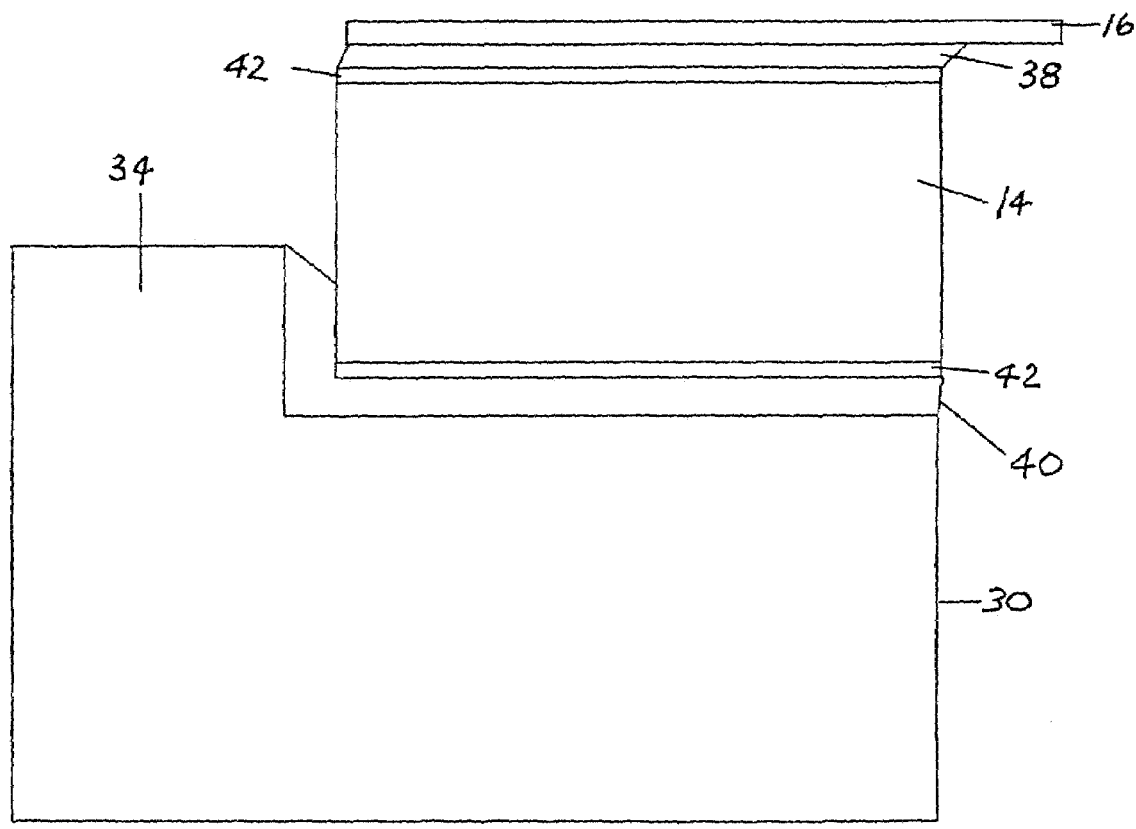

FIGS. 6A and 6B are sectional views of a portion of a semiconductor package similar to the package 10 of FIG. 1 but with the flange 30 used therein. The flange 30 with its raised pedestal 34 is shown in the lower portion of FIG. 6B. A portion of the window frame 14 is shown in the upper right hand portion of FIG. 6B. A lead 16 is bonded on the top of the window frame 14. In the example of FIGS. 6A and 6B, the window frame 14, the lead 16 and the flange 30 are bonded together by brazing. As can be seen in FIG. 6B, a thin layer 38 of the brazing material is disposed between the window frame 14 and the lead 16 so as to join such components together. Similarly, a thin layer 40 of the brazing material extends along the interface between window frame 14 and the flange 30. During bonding of the window frame 14 to the flange 30, the brazing material of the layer 40 extends along the interface therebetween as shown. However, the raised pedestal 34 prevents the brazing material from flowing onto the die attach area formed by the flat upper surface 36 of the pedestal 34.

Dies attached to the header 24 require a relatively smooth surface, typically having a surface roughness of less than 40 u. The raised periphery of the pedestal 34 of the flange 30 acts as a barrier to prevent flow of the brazing material onto the flat upper surface 36 thereof forming the die attach area. The pedestal 34 of the flange 30 can be formed by any appropriate technique such as by machining or by stamping. Clad material 42 with an optional coating is shown between the brazing layer 38 and the window frame 14 and also between brazing layer 40 and the window frame 14.

Figure 7A:
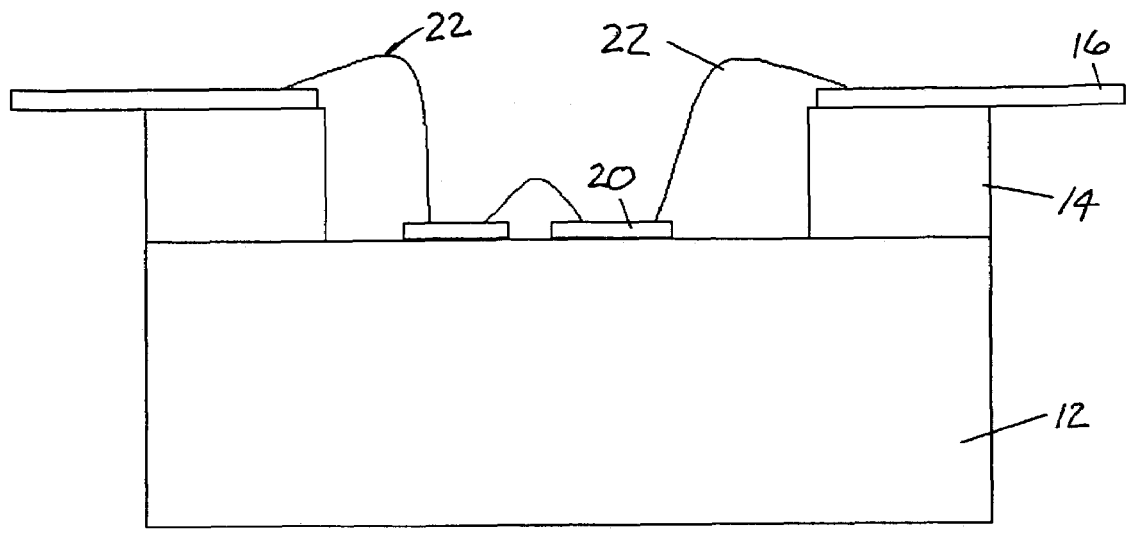
FIGS. 7A and 7B are sectional views of a portion of a semiconductor package showing the manner in which the clad material may become the flange and/or leads.
Figure 7B:
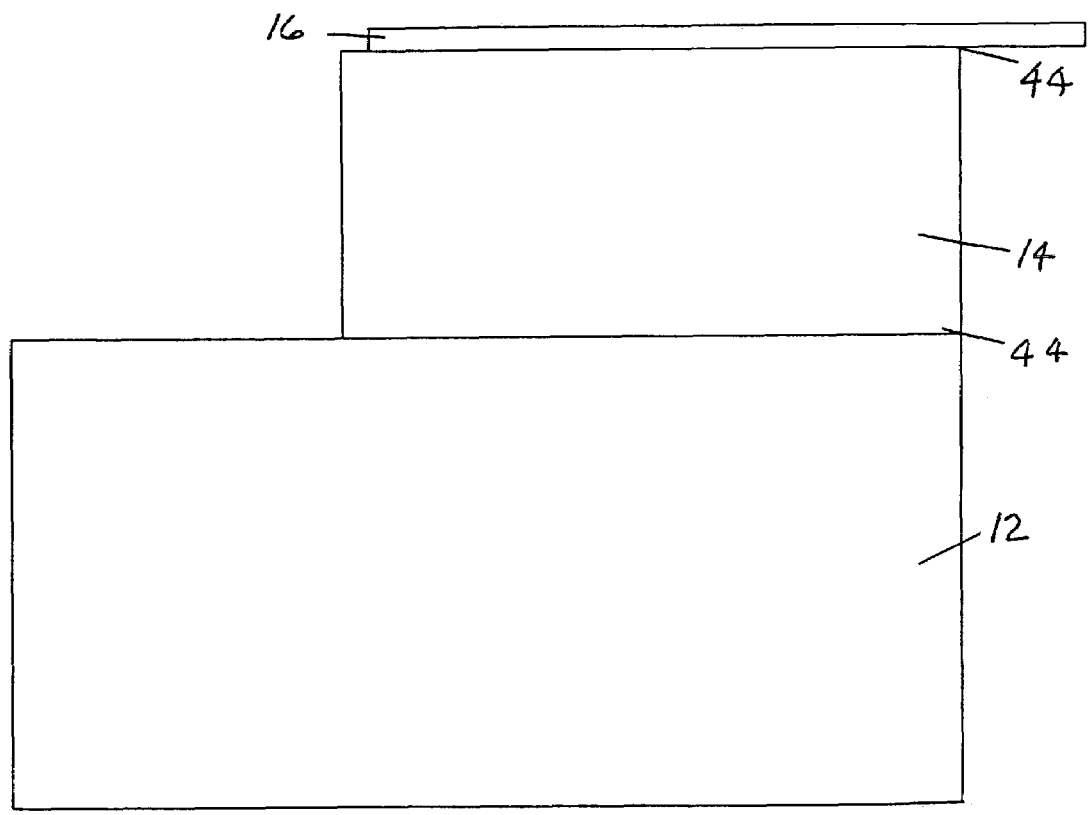

Again as previously described, lamination techniques can be used to join the flange directly to the non-ceramic based material of the window frame. Also, the cladding layer can be provided with sufficient thickness so that it forms the flange when joined to the window frame. FIG. 7A is a sectional view of the semiconductor package 10 with the previously described flange 12 which does not have a pedestal. In FIG. 7B, the window is shown adhered to the lead 16 and to the flange 12 by cladding. The cladding provides adhesion at the interfaces 44 at the opposite surfaces of the window frame 14.

The presently disclosed embodiments are to be considered in all respect as illustrative and not restrictive, the scope of the invention being indicated by the appended claims, rather than the foregoing description, and all changes which come within the meaning and range of equivalency of the claims are therefore intended to be embraced herein.

What is claimed is:

1. A semiconductor package comprising a heat sink flange, a window frame of non-ceramic based, electrically insulating material mounted on the heat sink flange, and leads mounted on the window frame, wherein the window frame is made of a matrix of polytetrafluoroethylene filled with fibers and clad in metal, wherein the metal cladding is plated with nickel and/or gold and the window frame is brazed to the flange and to the leads with braze/solder/adhesive material.

2. A semiconductor package according to claim 1, wherein the window frame is clad in copper, and at least one of the flange and the leads comprise(s) part of the copper cladding of the window frame.

3. A semiconductor package according to claim 1, wherein the window frame is bonded to the flange with gold/germanium solder which has a given melting temperature, and further including a die bonded to the flange with a gold/tin mixture having a melting temperature less than the given melting temperature of the gold/germanium solder.

* * * * *